United States Patent
Park et al.

(10) Patent No.: US 8,704,365 B2
(45) Date of Patent: Apr. 22, 2014

(54) INTEGRATED CIRCUIT PACKAGING SYSTEM HAVING A CAVITY

(75) Inventors: DongSam Park, Ichon-si (KR); Dongjin Jung, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/187,252

(22) Filed: Jul. 20, 2011

(65) Prior Publication Data

US 2011/0272807 A1 Nov. 10, 2011

Related U.S. Application Data

(63) Continuation of application No. 12/192,052, filed on Aug. 14, 2008, now Pat. No. 7,989,950.

(51) Int. Cl.
 *H01L 23/34* (2006.01)

(52) U.S. Cl.
 USPC ............ 257/724; 257/E21.499; 257/E23.001; 257/E33.059; 257/E23.02; 438/106; 438/127

(58) Field of Classification Search
 USPC ...................... 438/106–127, 25–28; 257/724, 257/E21.499, E23.001, E33.059, E23.02
 See application file for complete search history.

(56) References Cited

U.S. PATENT DOCUMENTS

| | | |
|---|---|---|
| 5,477,082 A | 12/1995 | Buckley, III et al. |
| 5,478,781 A | 12/1995 | Bertin et al. |
| 5,621,242 A | 4/1997 | Mok et al. |
| 5,642,261 A | 6/1997 | Bond et al. |
| 5,696,666 A | 12/1997 | Miles et al. |
| 5,732,465 A | 3/1998 | Tokita et al. |
| 6,020,221 A | 2/2000 | Lim et al. |
| 6,072,233 A | 6/2000 | Corisis et al. |
| 6,084,297 A | 7/2000 | Brooks et al. |
| 6,117,704 A | 9/2000 | Yamaguchi et al. |
| 6,124,637 A | 9/2000 | Freyman et al. |
| 6,168,972 B1 | 1/2001 | Wang et al. |
| 6,172,491 B1 | 1/2001 | Nathan |
| 6,313,528 B1 | 11/2001 | Solberg |
| 6,372,619 B1 | 4/2002 | Huang et al. |
| 6,387,731 B1 | 5/2002 | Wensel et al. |
| 6,388,333 B1 | 5/2002 | Taniguchi et al. |
| 6,396,143 B1 | 5/2002 | Kimbara et al. |
| 6,489,182 B2 | 12/2002 | Kwon |
| 6,501,184 B1 | 12/2002 | Shin et al. |
| 6,506,626 B1 | 1/2003 | Chiu |
| 6,534,160 B2 | 3/2003 | Farquhar et al. |
| 6,564,454 B1 | 5/2003 | Glenn et al. |
| 6,649,445 B1 | 11/2003 | Qi et al. |
| 6,653,217 B1 | 11/2003 | Lin |
| 6,670,219 B2 | 12/2003 | Lee et al. |
| 6,779,783 B2 | 8/2004 | Kung et al. |
| 6,784,020 B2 | 8/2004 | Lee et al. |
| 6,787,916 B2 | 9/2004 | Halahan |
| 6,790,710 B2 * | 9/2004 | McLellan et al. ............. 438/122 |
| 6,815,254 B2 | 11/2004 | Mistry et al. |

(Continued)

*Primary Examiner* — Alexander Sofocleous
*Assistant Examiner* — Ankush Singal
(74) *Attorney, Agent, or Firm* — Ishimaru & Associates LLP

(57) ABSTRACT

An integrated circuit packaging system includes: a carrier, having a carrier top side and a carrier bottom side, without an active device attached to the carrier bottom side; an interconnect over the carrier; and a first encapsulation, having a cavity, around the interconnect over the carrier top side with the interconnect partially exposed from the first encapsulation, and with the carrier top side partially exposed with the cavity.

10 Claims, 6 Drawing Sheets

(56) References Cited

U.S. PATENT DOCUMENTS

| | | | |
|---|---|---|---|
| 6,819,989 B2 | 11/2004 | Maeda et al. | |
| 6,936,922 B1 * | 8/2005 | Park et al. | 257/737 |
| 6,982,485 B1 | 1/2006 | Lee et al. | |
| 7,067,911 B1 | 6/2006 | Lin et al. | |
| 7,122,906 B2 | 10/2006 | Doan | |
| 7,273,768 B2 | 9/2007 | Hwan | |
| 7,303,947 B1 | 12/2007 | Bronecke et al. | |
| 7,307,850 B2 | 12/2007 | Rumsey | |
| 7,334,476 B2 | 2/2008 | Ichikawa | |
| 7,339,278 B2 | 3/2008 | Iksan et al. | |
| 7,642,133 B2 | 1/2010 | Wu et al. | |
| 7,653,991 B2 * | 2/2010 | Mok et al. | 29/847 |
| 7,669,320 B2 * | 3/2010 | Hurwitz et al. | 29/846 |
| 7,714,453 B2 * | 5/2010 | Khan et al. | 257/787 |
| 7,718,901 B2 * | 5/2010 | Takahashi et al. | 174/254 |
| 7,727,862 B2 * | 6/2010 | Jobetto | 438/464 |
| 7,741,194 B2 | 6/2010 | Griffiths | |
| 7,768,125 B2 | 8/2010 | Chow et al. | |
| 7,884,466 B2 * | 2/2011 | Ishihara et al. | 257/700 |
| 7,928,552 B1 * | 4/2011 | Cho et al. | 257/686 |
| 8,030,746 B2 * | 10/2011 | Tan | 257/686 |
| 8,304,878 B2 * | 11/2012 | Appelt | 257/686 |
| 2001/0028110 A1 | 10/2001 | Andoh | |
| 2002/0163064 A1 * | 11/2002 | Aquien et al. | 257/678 |
| 2003/0148552 A1 | 8/2003 | Halahan | |
| 2004/0016939 A1 | 1/2004 | Akiba et al. | |
| 2004/0104478 A1 | 6/2004 | Noguchi | |
| 2005/0009259 A1 | 1/2005 | Farnworth | |
| 2005/0056942 A1 * | 3/2005 | Pogge et al. | 257/778 |
| 2005/0121764 A1 | 6/2005 | Mallik et al. | |
| 2005/0130349 A1 * | 6/2005 | Sunohara | 438/108 |
| 2005/0170561 A1 | 8/2005 | Huang et al. | |
| 2005/0184404 A1 * | 8/2005 | Huang et al. | 257/787 |
| 2005/0269700 A1 | 12/2005 | Farnworth et al. | |
| 2006/0091567 A1 | 5/2006 | Lin et al. | |
| 2006/0105496 A1 | 5/2006 | Chen et al. | |
| 2006/0205119 A1 | 9/2006 | Appelt et al. | |
| 2006/0255449 A1 * | 11/2006 | Lee et al. | 257/698 |
| 2006/0284057 A1 | 12/2006 | Park | |
| 2007/0096292 A1 * | 5/2007 | Machida | 257/700 |
| 2007/0148822 A1 | 6/2007 | Haba et al. | |
| 2007/0158806 A1 | 7/2007 | Kwon et al. | |
| 2007/0190690 A1 | 8/2007 | Chow et al. | |
| 2007/0215380 A1 | 9/2007 | Shibamoto | |
| 2007/0290319 A1 | 12/2007 | Kim | |
| 2007/0290376 A1 * | 12/2007 | Zhao et al. | 257/787 |
| 2008/0029870 A1 * | 2/2008 | Chen et al. | 257/686 |
| 2008/0073769 A1 | 3/2008 | Wu et al. | |
| 2008/0090335 A1 * | 4/2008 | Morimoto et al. | 438/118 |
| 2008/0111233 A1 | 5/2008 | Pendse | |
| 2008/0128865 A1 * | 6/2008 | Chia | 257/620 |
| 2008/0185704 A1 * | 8/2008 | Hsu et al. | 257/690 |
| 2008/0197491 A1 * | 8/2008 | Matsui | 257/737 |
| 2008/0230887 A1 * | 9/2008 | Sun et al. | 257/686 |
| 2008/0258286 A1 * | 10/2008 | Gerber et al. | 257/686 |
| 2008/0258289 A1 * | 10/2008 | Pendse et al. | 257/690 |
| 2008/0258293 A1 | 10/2008 | Yang et al. | |
| 2008/0263860 A1 * | 10/2008 | Mok et al. | 29/847 |
| 2008/0265395 A1 * | 10/2008 | Hasegawa et al. | 257/690 |
| 2008/0280394 A1 * | 11/2008 | Murtuza et al. | 438/109 |
| 2008/0296056 A1 | 12/2008 | Kinoshita et al. | |
| 2009/0008801 A1 | 1/2009 | Lai et al. | |
| 2009/0014871 A1 | 1/2009 | Meyer et al. | |
| 2009/0015285 A1 | 1/2009 | Farooq et al. | |
| 2009/0042336 A1 * | 2/2009 | Paik et al. | 438/107 |
| 2009/0085204 A1 | 4/2009 | Park et al. | |
| 2009/0096097 A1 * | 4/2009 | Kagaya et al. | 257/737 |
| 2009/0107708 A1 * | 4/2009 | Takahashi et al. | 174/257 |
| 2009/0215231 A1 * | 8/2009 | Inoue | 438/125 |
| 2009/0243065 A1 * | 10/2009 | Sugino et al. | 257/686 |
| 2009/0243072 A1 | 10/2009 | Ha et al. | |
| 2010/0044853 A1 * | 2/2010 | Dekker et al. | 257/692 |
| 2010/0244219 A1 * | 9/2010 | Pagaila et al. | 257/686 |
| 2010/0255641 A1 * | 10/2010 | Nakanishi et al. | 438/127 |
| 2010/0330742 A1 * | 12/2010 | Sugiyama et al. | 438/107 |
| 2011/0024899 A1 * | 2/2011 | Masumoto et al. | 257/737 |
| 2011/0108875 A1 * | 5/2011 | Takenaka et al. | 257/98 |

\* cited by examiner

INTEGRATED CIRCUIT PACKAGING SYSTEM HAVING A CAVITY

CROSS-REFERENCE TO RELATED APPLICATION(S)

This is a continuation of U.S. patent application Ser. No. 12/192,052 filed Aug. 14, 2008, now U.S. Pat. No. 7,989,950.

TECHNICAL FIELD

The present invention relates generally to an integrated circuit packaging and more particularly to packaging substrates.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP).

Typically semiconductor dice are attached to a laminate substrate either using a die attach adhesive, or in case of a flip chip using ball grid array attach method followed by an epoxy underfill. Both processes require elevated temperature to either cure the die attach adhesive, or to flow the solder.

The elevated temperature presents a number of issues such as package warpage due to differing coefficients of thermal expansion between the die, the adhesive, and the laminate substrate. Warpage causes failures such as cracks in solder, or broken dice.

An additional challenge is presented when a package is molded with a resin after a die is attached to a carrier. A mold chase or dam used to form an encapsulation may contact the die and cause the die to crack. Also contact of the mold chase with the substrate may cause mechanical stress and warpage. Traditionally warpage has been addressed by using a thick laminate substrate, however, such a solution results in a substrate price that is two to three times higher than that of a functionally equivalent thinner substrate.

Thus, a need still remains for an integrated circuit packaging system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including: a carrier, having a carrier top side and a carrier bottom side, without an active device attached to the carrier bottom side; an interconnect over the carrier; and a first encapsulation, having a cavity, around the interconnect over the carrier top side with the interconnect partially exposed from the first encapsulation, and with the carrier top side partially exposed with the cavity.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
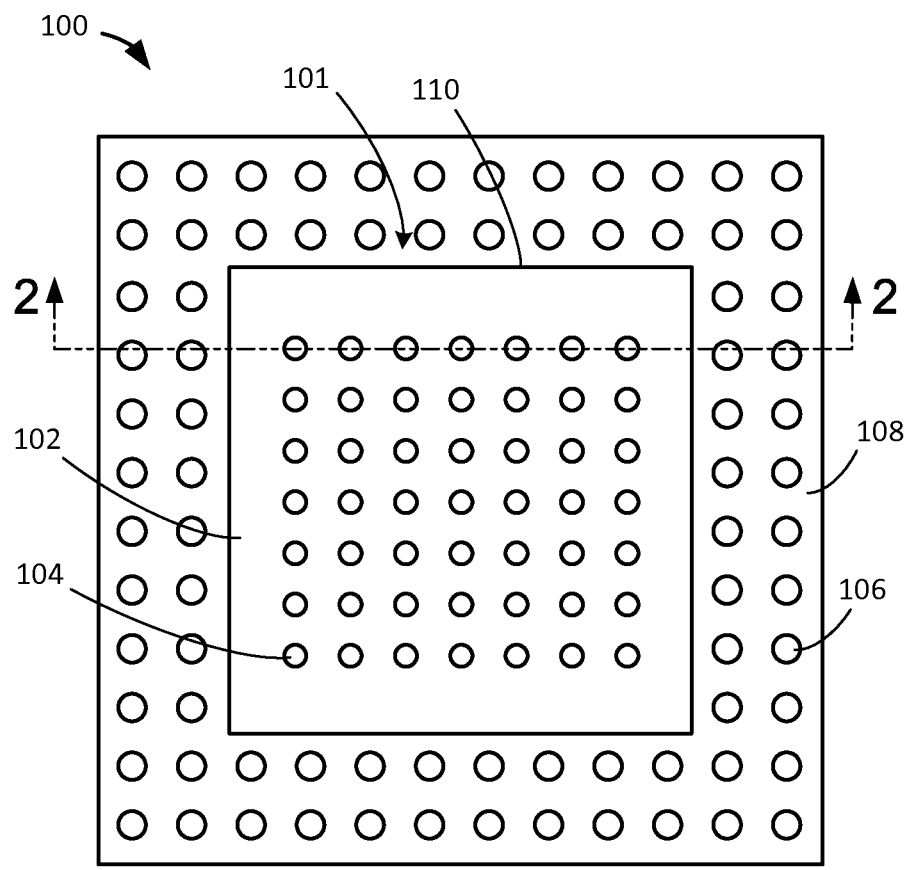
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit packaging system 100 in a first embodiment of the present invention. The top view depicts a carrier 101, such as a laminate substrate, having a carrier top side 102. The carrier top side 102 can have connection sites 104, such as solder pads.

Interconnects 106, such as solder balls, can be positioned around a perimeter of an exposed portion of the carrier top side 102. The interconnects 106 can be partially encapsulated by a first encapsulation 108, such as an epoxy resin. The first encapsulation 108 can be formed along the periphery of the carrier 101. The first encapsulation 108 can form a cavity 110 such that a portion of the carrier top side 102 is exposed.

Figure 2:
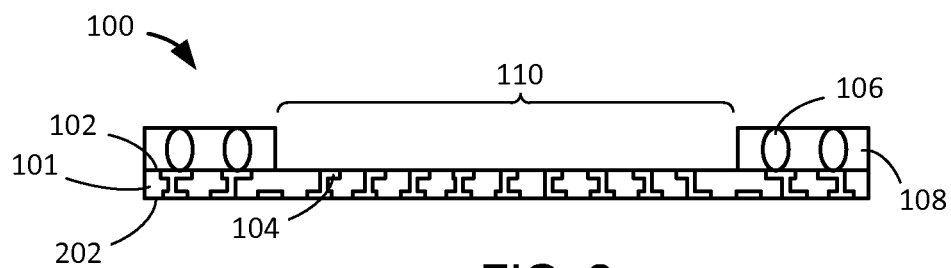
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The carrier 101 having the carrier top side 102 and a carrier bottom side 202 can have the interconnects 106 connected to the connection sites 104 exposed along the carrier top side 102. The interconnects 106 can be partially encapsulated by the first encapsulation 108 such that the interconnects 106 are exposed at the top of the first encapsulation 108. The interconnects 106 can include a height greater than a width. The height is a vertical distance between bottom and top extents of the interconnects 106. The width is a horizontal distance between horizontal extents of the interconnects 106.

The interconnects 106 can be formed in a number of configurations and from a number of materials. For example, the interconnects 106 can be formed a vertical configuration over the carrier top side 102. The interconnects 106 can be planarized to form a flat surface planar with the first encapsulation 108. The first encapsulation 108 can form the cavity 110 such that the carrier top side 102 is exposed.

It has been discovered that the present invention provides an integrated circuit packaging system with improved reliability, lower manufacturing equipment cost, improved yield, and lower overall cost. The present invention improves yield and lowers overall cost by forming an encapsulation over the substrate before die attach or chip attach process. The encapsulation forms a mechanically rigid structure providing planar rigidity and reducing warping, which in turn reduces carrier damage thereby increasing yield. The manufacturing cost is also reduced because it is no longer required to use a thicker substrate which is more costly.

Figure 3:
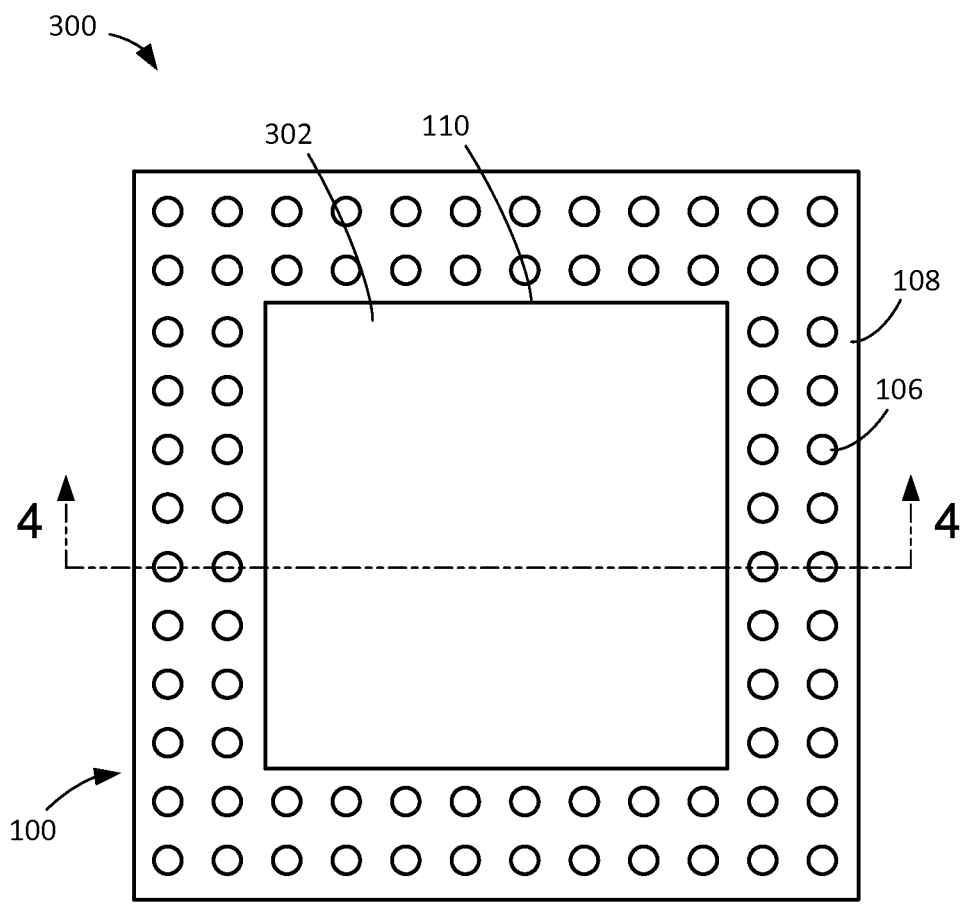
FIG. 3 is a top view of an integrated circuit package system in a first example application of the integrated circuit packaging system of FIG. 1 in a second embodiment of the present invention.

Referring now to FIG. 3, therein is shown a top view of an integrated circuit package system 300 in a first example application of the integrated circuit packaging system 100 of FIG. 1 in a second embodiment of the present invention. The top view depicts the first encapsulation 108 with partially exposing the interconnects 106.

The cavity 110 can be filled with second encapsulation 302, such as an epoxy resin. The second encapsulation 302 can have different properties than the first encapsulation 108. For example, the second encapsulation 302 may be optically transparent, and the first encapsulation 108 may be optically opaque, or the first encapsulation 108 and the second encapsulation 302 may have differing thermal conductive properties.

Figure 4:
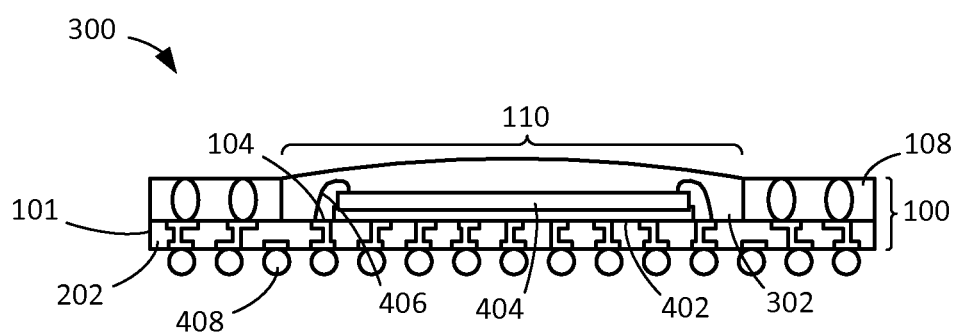
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. An integrated circuit 404, such as an integrated circuit die, can be over the carrier 101 within the cavity 110 of the integrated circuit packaging system 100. The integrated circuit 404 can be attached to the carrier 101 by an adhesive 402, such as a die-attach adhesive. The integrated circuit 404 is an example of an active device having active circuitry fabricated thereon. Circuit interconnects 406, such as bond wires or ribbon bond wires, can connect the integrated circuit 404 and the carrier 101 at the connection sites 104 within the cavity 110.

The integrated circuit 404 and the circuit interconnects 406 can be encapsulated by the second encapsulation 302 such that the cavity 110 is filled with the second encapsulation 302. The second encapsulation 302 does not extend beyond the horizontal boundaries of the cavity 110, and may have a vertical profile higher than that of the first encapsulation 108 providing a stand off height. External interconnects 410, such as solder balls, can be attached to the carrier bottom side 202 of the carrier 101.

It has also been discovered that the present invention provides the integrated circuit package system that is formed with an encapsulation before die or chip attach. This encapsulated structure prevents die cracking in applications where the packaging requires an exposed die because contact between a die and a mold chase have been eliminated.

It has been further discovered that the present invention provides the integrated circuit package system with improved integration density by encapsulating the interconnects. Encapsulating the interconnects allows for a reduced pitch between each interconnects allowing for higher density connections when forming package-on-package (POP) systems. The encapsulation provides structural support to the interconnects while providing for the reduced pitch.

Figure 5:
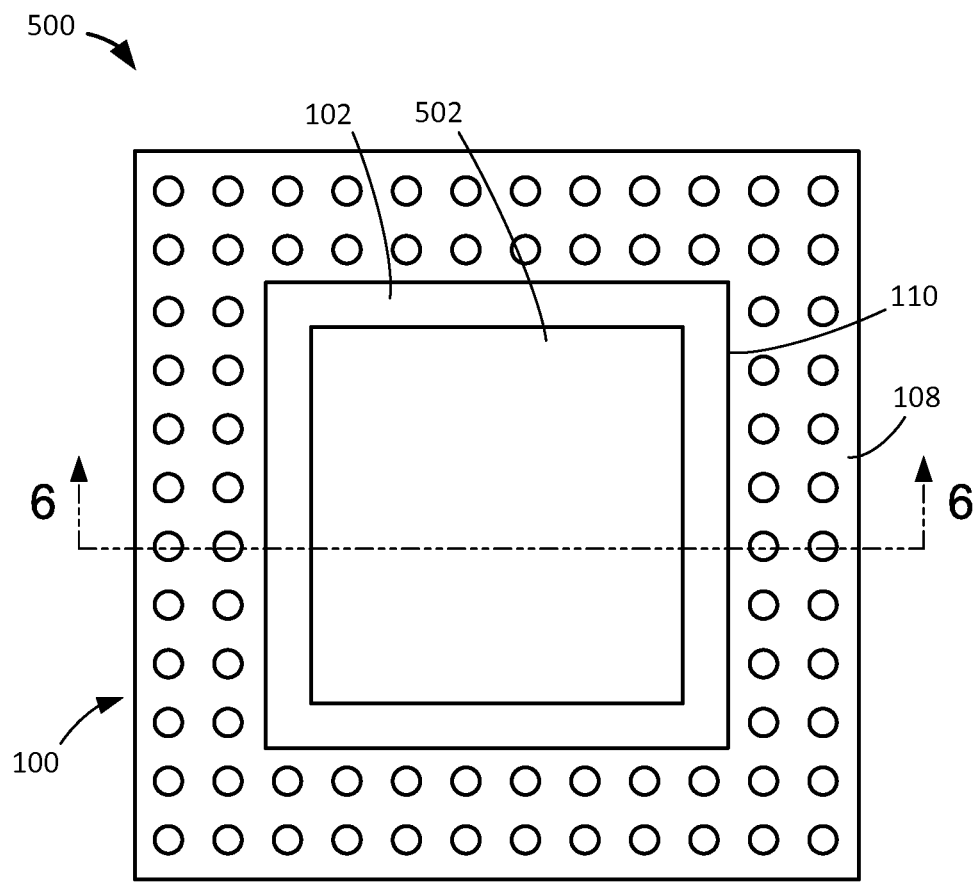
FIG. 5 is a top view of an integrated circuit package system in a second example application of the integrated circuit packaging system of FIG. 1 in a third embodiment of the present invention.

Referring now to FIG. 5, therein is shown is a top view of an integrated circuit package system 500 a second example application of the integrated circuit packaging system 100 of FIG. 1 in a third embodiment of the present invention. An integrated circuit 502, such as a flip chip, can be positioned within the cavity 110. The integrated circuit 502 horizontal dimensions can be smaller than that of the cavity 110 so that a portion of the carrier top side 102 is exposed within the cavity 110. The integrated circuit 502 does not contact the first encapsulation 108.

For illustrative purposes, the integrated circuit package system 500 is shown with the integrated circuit 502 not extending beyond the cavity 110, although it is understood that the integrated circuit package system 500 can have different types of devices mounted over the integrated circuit packaging system 100. For example, the integrated circuit 502 can extend beyond the cavity 110 and over the first encapsulation 108.

Figure 6:
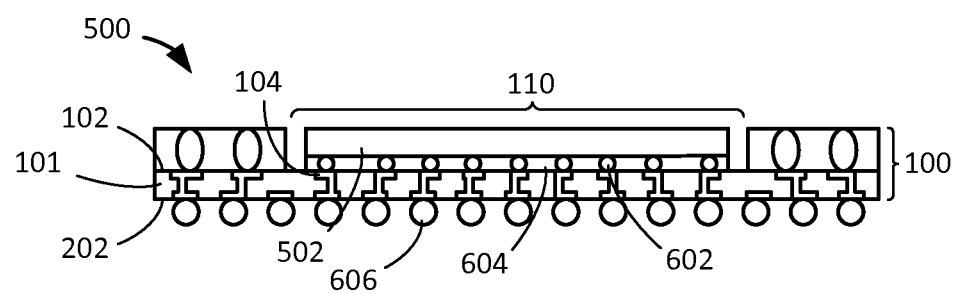
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The integrated circuit 502 can be mounted over the carrier top side 102. Device interconnects 602, such as solder bumps, can attach the integrated circuit 502 and the connection sites 104.

An underfill 604, such as an underfill epoxy, can be under the integrated circuit 502 and between the device interconnects 602 sealing spaces between the carrier top side 102 and the integrated circuit 502. External interconnects 606, such as solder balls, can attach to the carrier bottom side 202 of the carrier 101.

Figure 7:
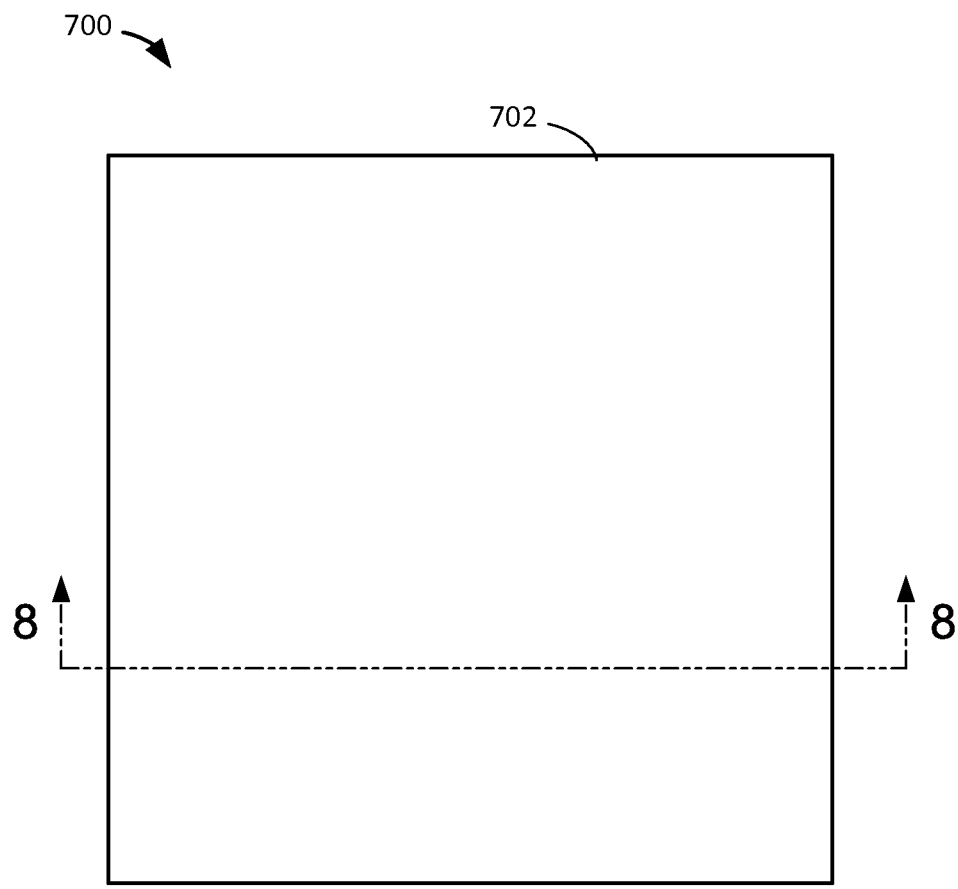
FIG. 7 is a top view of an integrated circuit package-on-package system in an example application of the integrated circuit package system of FIG. 6 in a fourth embodiment of the present invention.

Referring now to FIG. 7, is a top view of an integrated circuit package-on-package system 700 in an example application of the integrated circuit package system 500 of FIG. 6 in a fourth embodiment of the present invention. The top view shows an integrated circuit package 702. For illustrative purposes, the integrated circuit package-on-package system 700 is shown having a square geometric configuration, although it is understood that the integrated circuit package-on-package system 700 can have a different geometric configuration. For example, the integrated circuit package-on-package system 700 can have a rectangular configuration.

Figure 8:
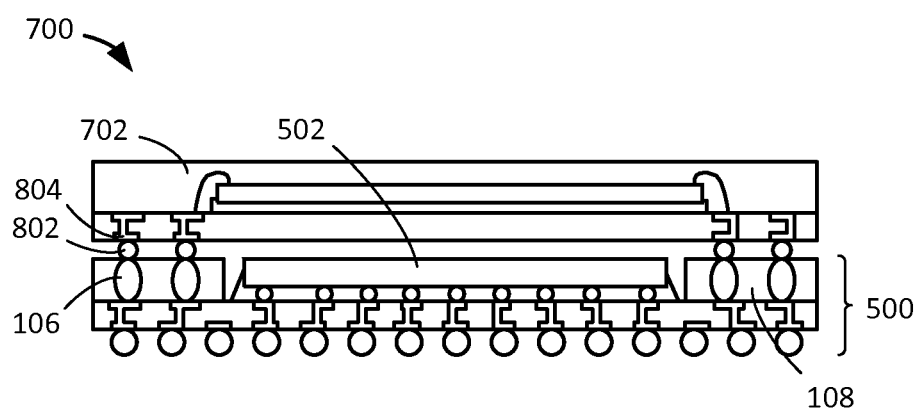
FIG. 8 is a cross-sectional view of the integrated circuit package system along line 8-8 of FIG. 7.

Referring now to FIG. 8, therein is shown a cross-sectional view of the integrated circuit package-on-package system 700 along line 8-8 of FIG. 7. The integrated circuit package-on-package system 700 includes of the integrated circuit package 702 mounted over the integrated circuit package system 500.

A gap can exist between the integrated circuit 502 and the bottom side of the integrated circuit package 702. Package interconnects 802, such as solder balls or micro-solder balls, can connect package contact pads 804 of the integrated circuit package 702 and the interconnects 106. The first encapsulation 108 can provide mechanical support to the interconnects 106 such that the interconnects 106 can withstand the mounting force from the integrated circuit package 702.

Figure 9:
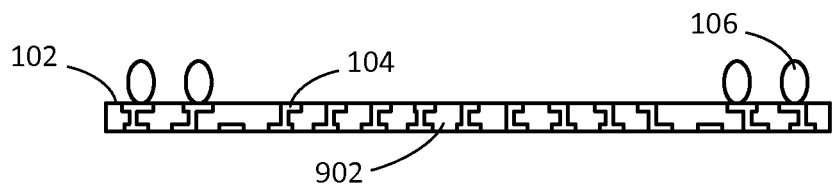
FIG. 9 is a cross sectional view of a portion of a carrier structure with the interconnects thereover.

Referring now to FIG. 9, therein is shown a cross sectional view of a portion of a carrier structure 902 with the interconnects 106 thereover. The interconnects 106 can attach to the connection sites 104 on the carrier top side 102 of the carrier structure 902. The interconnects 106 can be formed as a vertical structure.

Figure 10:
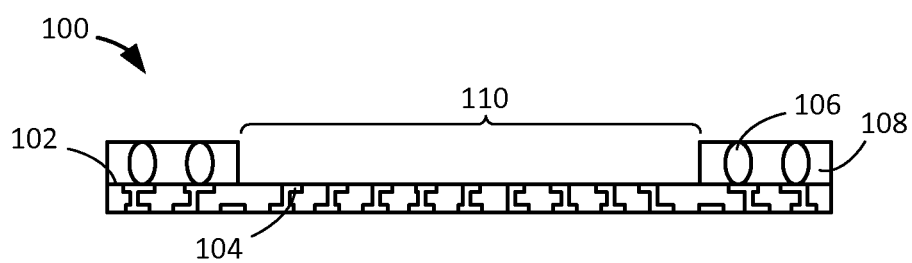
FIG. 10 is the structure of FIG. 9 in forming a first encapsulation over the carrier top side.

Referring now to FIG. 10, therein is shown the structure of FIG. 9 in forming the first encapsulation 108 over the carrier top side 102. The first encapsulation 108 partially seals the interconnects 106 such that the top surface of the interconnects 106 is exposed from the first encapsulation 108. The first encapsulation 108 can form the cavity 110 such that the carrier top side 102 having the connection sites 104 is exposed within the cavity 110.

Figure 11:
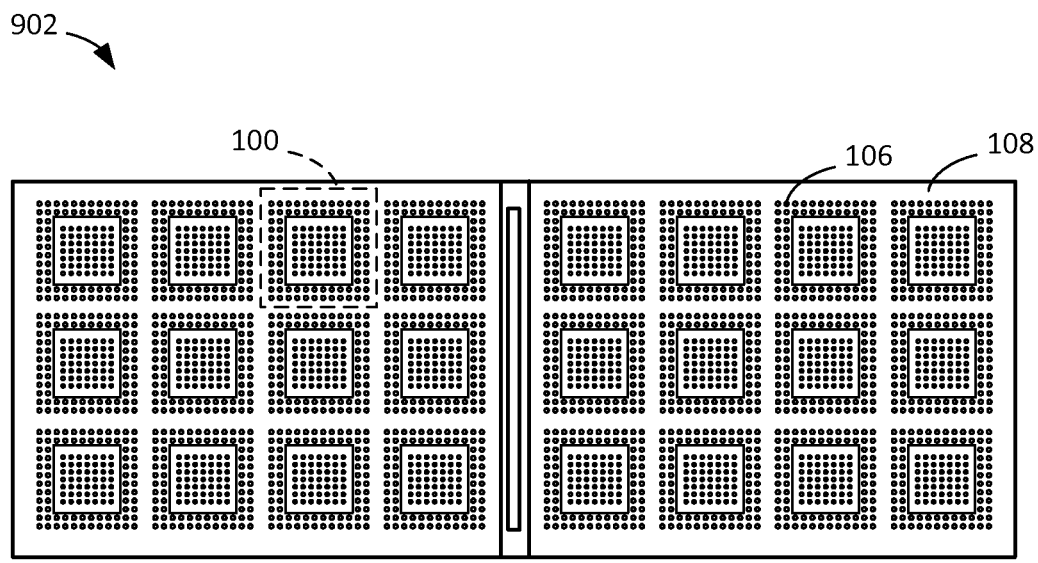
FIG. 11 is a top view of the structure of FIG. 10.

Referring now to FIG. 11, therein is shown a top view of the structure of FIG. 10. The integrated circuit packaging system 100 can be assembled with the carrier structure 902 having the first encapsulation 108 surrounding the interconnects 106.

Upon completion, the carrier structure 902 can then be singulated to form the integrated circuit packaging system 100.

Figure 12:
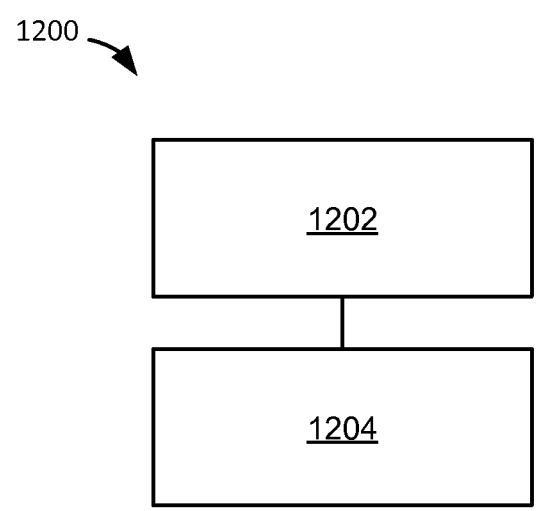
FIG. 12 is a flow chart of an integrated circuit packaging system for manufacture of the integrated circuit packaging system in an embodiment of the present invention.

Referring now to FIG. 12, therein is shown a flow chart of an integrated circuit packaging system 1200 for manufacture of the integrated circuit packaging system 100 in an embodiment of the present invention. The system 1200 includes attaching a carrier, having a carrier top side and a carrier bottom side, and an interconnect without an active device attached to the carrier bottom side in a block 1202; and forming a first encapsulation, having a cavity, around the interconnect over the carrier top side with the interconnect partially exposed from the first encapsulation and with the carrier top side partially exposed with the cavity in a block 1204.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a carrier, having a carrier top side and a carrier bottom side, without an active device attached to the carrier bottom side;
   an interconnect over the carrier;
   a first encapsulation, having a cavity, around the interconnect over the carrier top side with the interconnect partially exposed from the first encapsulation, and with the carrier top side partially exposed with the cavity, the first encapsulation having a different material composition than the carrier; and
   an integrated circuit within the cavity and over the first encapsulation.

2. The system as claimed in claim 1 wherein the integrated circuit is over the carrier top side.

3. The system as claimed in claim 1 wherein:
   the integrated circuit is over the carrier; and further comprising:
   a second encapsulation over the integrated circuit with the cavity filled with the second encapsulation.

4. The system as claimed in claim 1 wherein the first encapsulation is along the periphery of the carrier.

5. The system as claimed in claim 1 further comprising:
   an integrated circuit package over the first encapsulation; and a package interconnect between the integrated circuit package and the interconnect.

6. The system as claimed in claim 1 wherein:
the interconnect is formed in a vertical configuration; and
the first encapsulation is along the periphery of the carrier.

7. The system as claimed in claim 6 wherein the integrated circuit is over the carrier.

8. The system as claimed in claim 6 wherein the carrier top side includes a connection site attached to the interconnect.

9. The system as claimed in claim 6 further comprising the interconnect includes a solder ball.

10. The system as claimed in claim 6 further comprising an external interconnect attached to the carrier bottom side.

\* \* \* \* \*